United States Patent [19]

Kimura

[11] 4,321,468

[45] Mar. 23, 1982

[54] METHOD AND APPARATUS FOR CORRECTING ASTIGMATISM IN SCANNING ELECTRON MICROSCOPES AND SIMILAR EQUIPMENT

[75] Inventor: Takashi Kimura, Zama, Japan

[73] Assignee: Kabushiki Kaisha Akashi Seisakusho, Japan

[21] Appl. No.: 167,134

[22] Filed: Jul. 9, 1980

[30] Foreign Application Priority Data

Jul. 12, 1979 [JP] Japan ................................. 54-88409

[51] Int. Cl.³ .......................................... G01N 23/00
[52] U.S. Cl. ................................... 250/307; 250/310; 250/311
[58] Field of Search ............... 250/310, 311, 396, 397, 250/307

[56] References Cited

U.S. PATENT DOCUMENTS 3,753,034  8/1973  Spicer ................................... 250/396
4,162,403  7/1979  Baumgarten ........................ 250/311
4,180,738 12/1979  Smith et al. ......................... 250/311

OTHER PUBLICATIONS

"The Scanning Electron Microscope: Part I, The Inst.," Oatley, *Cambridge Univ. Press*, 1972, pp. 71-74.

*Primary Examiner*—Bruce C. Anderson
*Attorney, Agent, or Firm*—Robert E. Burns; Emmanuel J. Lobato; Bruce L. Adams

[57] ABSTRACT

This invention relates to a method of correcting astigmatism in scanning electron microscopes and similar equipment which insures accurate correction of astigmatism simply by matching an astigmatism-correcting image, appearing on part of a Braun tube screen, to a predetermined point (such as a mark) on the screen, instead of depending on skill and perception. The apparatus for correcting astigmatism in scanning electron microscopes and similar equipment according to this invention provides a simple structure to implement the above astigmatism correcting method, connecting the X direction astigmatism correcting system through a first switch to one of the horizontal and vertical scanning systems and the Y direction astigmatism correcting system through the second switch to the other thereof.

9 Claims, 5 Drawing Figures

METHOD AND APPARATUS FOR CORRECTING ASTIGMATISM IN SCANNING ELECTRON MICROSCOPES AND SIMILAR EQUIPMENT

DETAILED DESCRIPTION OF THE INVENTION

This invention relates to a method and apparatus for correcting astigmatism in scanning electron microscopes and similar equipment.

BACKGROUND OF THE INVENTION

In a scanning electron microscope or similar equipment, electron beams focused on the specimen must generally be circular. Depending on the condition of the objective lens and the course through which the electron beams pass, especially the stain on the aperture inserted in the objective lens, however, the focused beams form an elliptical point instead of a circular one.

This distorted condition is known as the astigmatism of electron beams.

Conventionally, such astigmatism has been corrected by provding an astigmatism correction coil d in addition to a deflection coil c which two-dimensionally scans a specimen a with electron beams b, as shown in FIG. 1. This correction is accomplished by first adjusting the focus of the specimen image to the correct focus watching the image on the screen of a Braun tube e, then controlling the current flowing to the coil d turning potentiometers f and g until the blurred specimen image becomes sharp.

In FIG. 1, reference characters h and i designate circuits generating sawtooth waves for horizontal and vertical scanning, j and k magnifying power switching circuits, l and m power sources for correcting astigmatism in the X and Y directions, and n an amplifier.

The conventional astigmatism correcting means shown in FIG. 1, however, cannot insure accurate correction, since its correction is based on the finding of a point where the specimen image on the Braun tube e becomes sharpest, turning the potentiometers f and g at the operator's discretion. This calls for a skilled operator. Then, even the correction done by the skilled operator involve a subjective process of finding out the sharpest specimen imgage.

This invention is intended to solve such problems. The object of this invention is to provide an accurate, easy-to-operate method and apparatus for correcting astigmatism in scanning electron microscopes and similar equipment.

SUMMARY OF THE INVENTION

In order to achieve this object, the method of correcting astigmatism in scanning electron microscopes and similar equipment according to this invention comprises the steps of, in scanning electron microscopes having a Braun tube on which the image of a specimen is reproduced and similar equipment, matching the center of a specimen image as an astigmatism correcting image appearing on part of the screen of said Braun tube to a predetermined point on the screen by supplying one of two sawtooth waves which synchronize with horizontal and vertical scanning sawtooth waves for scanning charged corpuscular rays horizontally and vertically together with an X direction astigmatism correcting current to an X direction astigmatism correcting member, supplying the other of said sawtooth waves together with a Y direction astigmatism correcting current to a Y direction astigmatism correcting member, then controlling the X and Y direction astigmatism correcting currents, and stopping the supply of said sawtooth waves to the X and Y direction astigmatism correcting members.

The apparatus for correcting astigmatism in scanning electron microscopes and similar equipment according to this invention comprises, in a scanning microscope and similar equipment, a Braun tube to reproduce the image of a specimen, a horizontal scanning system including a horizontal sawtooth wave generator for supplying horizontal scanning sawtooth waves to a horizontal scanning deflection member in the Braun tube and a horizontal scanning deflection member in the microscope, a vertical scanning system including a vertical sawtooth wave generator for supplying vertical scanning sawtooth waves to a vertical scanning deflection member in the Braun tube and a vertical scanning deflection member in the microscope, an X direcion astigmatism correcting system including an X direction astigmatism correcting current source for supplying an X direction astigmatism correcting current to an X direction astigmatism correcting member in the microscope, and a Y direction astigmatism correcting system including a Y direction astigmatism correcting current source for supplying a Y direction astigmatism correcting current to a Y direction astigmatism correcting member in the microscope, wherein the X direction astigmatism correcting system is connected through a first switch to one of the horizontal and vertical scanning systems and the Y direction astigmatism correcting system is connected through a second switch to the other of said scanning systems.

BRIEF DESCRIPTION OF THE DRAWINGS

Now a method and apparatus for correcting astigmatism in scanning electron microscopes and similar equipment embodying this invention will be described by reference to the accompanying drawings, in which.

DESCRIPTION OF THE PREFERRED EMBODIMENTS

Figure 1:
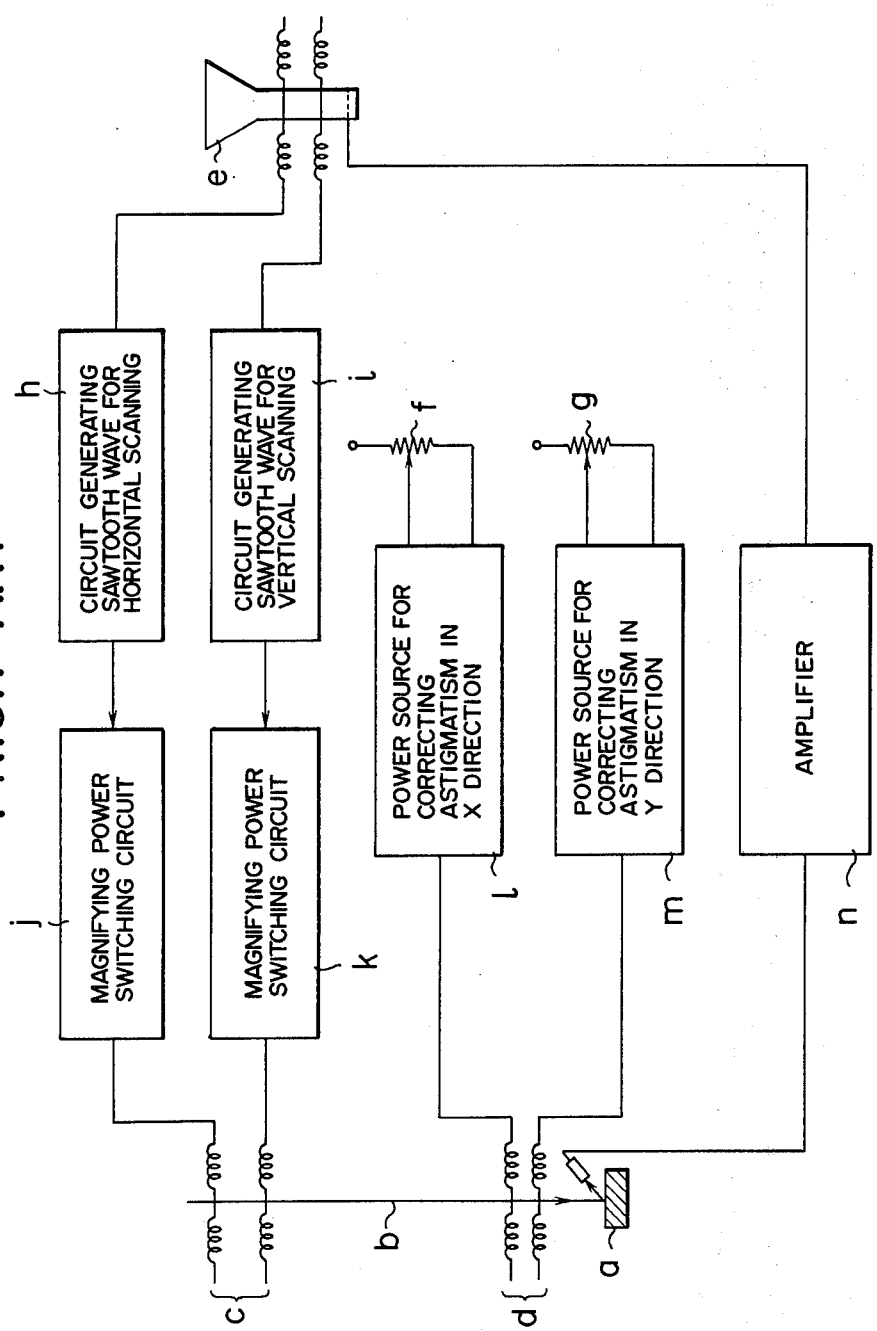
FIG. 1 represents a conventional astigmatism correcting system as earlier discussed.
Figure 2:
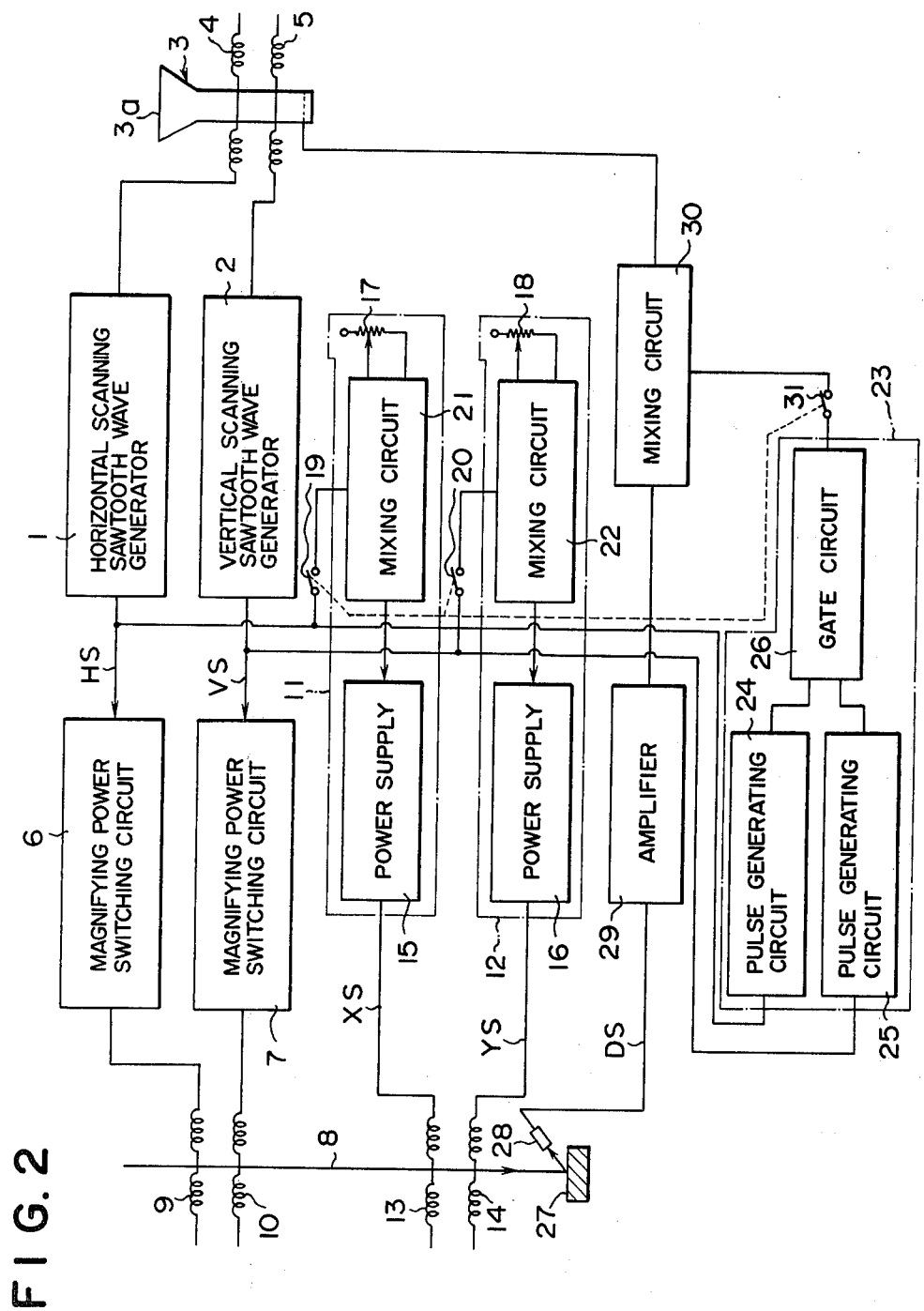
FIG. 2 is an electric circuit thereof.

As shown in FIG. 2, a horizontal and a vertical scanning sawtooth wave generator 1 and 2 are connected to deflection coils 4 and 5, constituting horizontal and vertical scanning deflection members, in a Braun tube 3, and also to deflection coils 9 and 10, constituting horizontal and vertical scanning deflection members scanning electron beams 8 which are charged corpuscular rays, in the microscope, through magnifying power switching circuits (magnification selectors) 6 and 7.

Accordingly, sawtooth waves from the circuit 1 are supplied through the magnifying power switching circuit 6, where the amplitude thereof is appropriately changed, to the deflection coil 9 where the electron beams 8 are horizontally scanned. Meanwhile, sawtooth waves synchronized with the sawtooth waves supplied to the deflection coil 9 are supplied to the coil 4 in the Braun tube 3, where the sawtooth waves are synchronized with the electron beams 8 to horizontally scan the electron beams in the Braun tube 3. Thus, the circuit 1, deflection coils 4 and 9, and magnifying power switching circuit 6 make up a horizontal scanning system HS.

Sawtooth waves from the circuit 2 and those synchronized therewith are supplied to deflection coils 5 and 10, in substantially the same manner as in the case of the horizontal scanning system HS, where the electron beams 8 in the microscope and the electron beams in the Braun tube 3 are vertically scanned. Then, the circuit 2, deflection coils 5 and 10, and magnifying power switching circuit 7 make up a vertical scanning system VS.

An X direction and a Y direction astigmatism correcting current source 11 and 12 are connected to correcting coils 13 and 14, which constitute an X direction and a Y direction astigmatism correcting member, the current sources 11 and 12 having power supplies 15 and 16 and potentiometers 17 and 18, respectively.

Accordingly, current (d.c.) from the current source 11 is supplied to the correcting coil 13 where the X direction astigmatism of the electron beams 8 is corrected. Thus, the current source 11 and correcting coil 13 make up an X direction astigmatism correcting system XS.

Current (d.c.) from the current source 12 is supplied to the correcting coil 14, in substantially the same manner as in the case of the X direction astigmatism correcting system XS, where the Y direction astigmatism of the electron beams 8 is corrected. Thus, the current source 12 and correcting coil 14 make up a Y direction astigmatism correcting system YS.

The horizontal scanning sawtooth wave generator 1 is connected through a first switch 19 to a mixing circuit 21 of the X direction astigmatism correcting current source 11, whereby the X direction astigmatism correcting system XS is connected through the first switch 19 to the horizontal deflection system HS.

The vertical scanning sawtooth wave generator 2 is connected through a second switch 20 interlocked with the first switch 19 to a mixing circuit 22 of the Y direction astigmatism correcting current source 12, whereby the Y direction astigmatism correcting system YS is connected through the second switch 20 to the vertical deflection system VS.

Consequently, when the first and second switches 19 and 20 are turned on, currents combining the astigmatism correcting currents and sawtooth waves are supplied from the current sources 11 and 12 to the correcting coils 13 and 14.

The sawtooth wave generating circuits 1 and 2 are connected to a mark generating circuit 23 which comprises pulse generating circuits 24 and 25 which generate pulses synchronized with the sawtooth waves from the circuits 1 and 2 and a gate circuit 26 which receives pulses from the pulse generating circuits 24 and 25 and produces an appropriate output.

When irradiated with the electron beams 8, a specimen 27 emits secondary and reflected electrons. These signals are detected by a detector 28, amplified by an amplifier 29, introduced into the grid or cathode of the Braun tube 3, then projected, through intensity modulation, as an image of the specimen on the screen 3a of the Braun tube 3. The detector 28, amplifier 29, etc. make up a signal detecting system DS.

The output side of the amplifier 29 in this signal detecting system DS is connected to a mixing circuit 30 which, in turn, is connected to the mark generating circuit 23 through a third switch 31 interlocked with the first and second switches 19 and 20.

When the third switch 31 is turned on, the pulse from the mark generating circuit 23 is supplied through the mixing circuit 30 to the grid or cathode of the Braun tube 3, whereupon a mark 32 is formed, through intensity modulation, on the screen 3a of the Braun tube 3.

This mark 32 can be formed in any shape and in any place of the screen 3a by adjusting the pulse output from the mark generating circuit 23. In this embodiment, the mark 32 is cross-shaped and positioned substantially at the center of the screen 3a.

When the third switch 31 is turned off, the mark 32 disappears from the screen 3a.

To correct astigmatism using the above-described astigmatism correcting apparatus of this invention, the image is correctly focused by operating a knob (not shown), then the first through third switches 19, 20 and 31 are turned on simultaneously.

On turning on the switches 19, 20 and 31, the sawtooth waves from the circuit 1 are supplied to the current source 11 and pulse generating circuit 24, and the sawtooth waves from the circuit 2 are supplied to the current source 12 and pulse generating circuit 25.

The current sources 11 and 12 supply currents $I_x$ and $I_y$ combined with the sawtooth waves (see FIG. 3) to the correcting coils 13 and 14. The mark generating circuit 23 supplies pulses for forming the mark through the mixing circuit 30 to the grid or cathode of the Braun tube 3.

Figure 3:
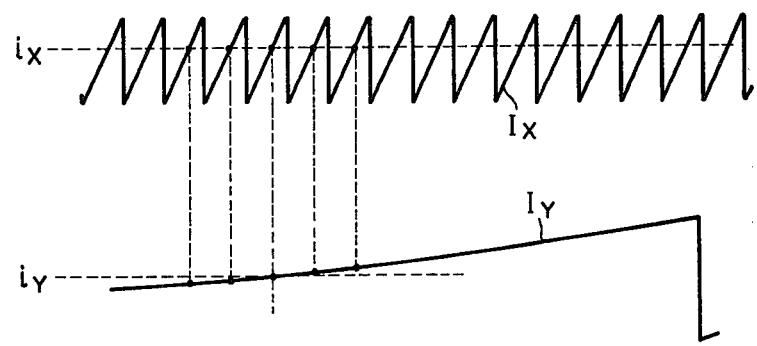
FIG. 3 is a waveform showing an operation to find out an astigmatism-free portion.
Figure 4:
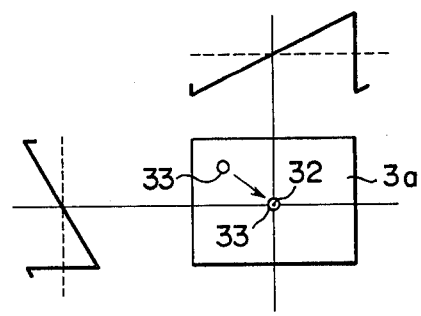
FIG. 4 schematically shows a mark used for the operation shown in FIG. 3.

The currents $I_x$ and $I_y$ are sawtoothed, as shown in FIG. 3. Consequently, astigmatism correcting currents $i_x$ and $i_y$ temporarily flow across the correcting coils 13 and 14, whereby as shown in FIG. 4, a circular astigmatism correcting image 33 is projected on part of the screen 3a of the Braun tube 3. No other image than the astigmatism correcting image 33 is formed on the remaining blurred part of the screen 3a.

At the same time, the mark 32 is formed, as a result of intensity modulation, substantially at the center of the screen 3a. As shown in FIG. 4, the mark 32 is formed in such a position of the screen 3a where the center of the sawtooth waves supplied to the horizontal scanning deflection coil 4 of the Braun tube 3 meets the center of the sawtooth waves supplied to the vertical scanning deflection coil 5 of the Braun tube 3. But this position does not always agree with the center of the screen 3a. This disagreement is due to the fact that the actual width of the screen 3a often disagrees with the amplitude of the sawtooth-wave-induced electron beams.

Thus the mark 32 is formed substantially at the center of the screen 3a.

Then, the potentiometers 17 and 18 are operated so that the astigmatism correcting image 33 is moved until the center thereof meets the mark 32, as indicated by the arrow in FIG. 4.

Figure 5:
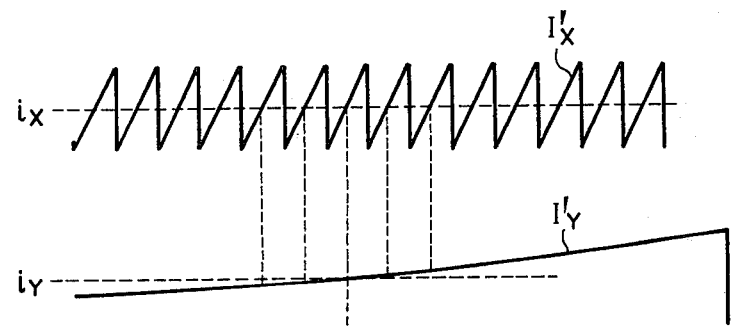
FIG. 5 is a waveform showing an operation to eliminate astigmatism.

This operation brings the astigmatism correcting currents $i_x$ and $i_y$ into agreement with the center of the currents $I'_x$ and $I'_y$ from the current sources 11 and 12, as shown in FIG. 5. In other words, the d.c. currents from the current sources 11 and 12 are brought into agreement with the currents $i_x$ and $i_y$, respectively.

The first through third switches 19, 20 and 31 are then turned off. As a consequence, the supply of the astigmatism correcting sawtooth waves to the X and Y direction astigmatism correcting coils 13 and 14 and the supply of the mark forming pulses from the mark generating circuit 23 to the grid or cathode of the Braun tube 3 are discontinued, whereupon the mark 32 disappears and, instead, an astigmatism-free image of the specimen is projected over the entirety of the screen 3a.

At this time, the currents $i_x$ and $i_y$ are supplied from the current sources 11 and 12 to the correcting coils 13 and 14, because the d.c. currents from the current sources 11 and 12 are matched to the astigmatism-correcting currents $i_x$ and $i_y$ by matching the center of the astigmatism-correcting image 33 to the mark 32. Once thus matched, the d.c. currents remains in agreement with the currents $i_x$ and $i_y$ even after the supply of the sawtooth waves is discontinued.

In this embodiment, the size of the astigmatism-correcting image 33 decreases as the magnifying power is increased, thereby facilitating the matching of the center of the image 33 to the mark 32.

In the above-described embodiment, the sawtooth waves were drawn from between the sawtooth wave genreating circuit 1 and the magnifying power switching circuit 6 of the horizontal scanning system HS, and also from between the sawtooth wave generating circuit 2 and the magnifying power switching circuit 7 of the vertical scanning system VS. The sawtooth waves may instead be drawn from between the circuit 1 and the deflection coil 4 of the Braun tube 3 and between the circuit 2 and the deflection coil 5 of the Braun tube 3, or they may be drawn from between the magnifying power switching circuit 6 and the deflection coil 9 in the microscope and between the magnifying power switching circuit 7 and the deflection coil 10 in the microscope.

The mark 32 may be stuck on the screen 3a, instead of being formed by intensity modulation.

The mark 32, which is formed substantially at the center of the screen 3a, may also be provided at any other suitable place. In this case, the potentiometers 17 and 18 are adjusted so that the d.c. currents from the current sources 11 and 12 are matched to the astigmatism-correcting currents $i_x$ and $i_y$ intersecting the sawtooth waves from the current sources 11 and 12 at a point other than the center thereof.

The mark 32, cross-shaped in the above embodiment, may also be a point or a ring in shape.

Instead of connecting the X direction astigmatism correcting system XS through the first switch to the horizontal scanning system HS and the Y direction astigmatism correcting system YS through the second switch to the vertical scanning system VS, as is done in the above-described embodiment, the Y direction astigmatism correcting system may be connected through a switch to the horizontal scanning system HS and the X direction astigmatism correcting system through a switch to the vertical scanning system VS.

As described at length above, the method of correcting astigmatism in scanning electron microscopes and similar equipment according to the present invention insures accurate correction of astigmatism simply by matching an astigmatism-correcting image, appearing on part of the Braun tube screen, to a predetermined point (such as a mark) on the screen, instead of depending on the skill and perception of a human operator.

The apparatus for correcting astigmatism in scanning electron microscopes and similar equipment according to this invention provides a simple structure to implement the above astigmatism correcting method, connecting the X direction astigmatism correcting system through the first switch to one of the horizontal and vertical scanning systems and the Y direction astigmatism correcting system through the second switch to the other thereof.

What is claimed is:

1. A method of correcting astigmatism in scanning electron microscope comprises steps of, in a scanning electron microscope having a Braun tube on which an image of a specimen is reproduced, moving an astigmatism correcting image, appearing on part of a screen of said Braun tube until matching a predetermined point on said screen by supplying one of said sawtooth waves which synchronize with horizontal and vertical scanning sawtooth waves for scanning charged corpuscular rays horizontally and vertically together with an X direction astigmatism correcting current to an X direction astigmatism correcting member, supplying the other of said sawtooth waves together with a Y direction astigmatism correcting current to a Y direction astigmatism correcting member, then controlling said X and Y direction astigmatism correcting currents, and stopping the supply of said sawtooth waves to said X and Y direction astigmatism correcting members.

2. An apparatus for correcting astigmatism in scanning electron microscopes according to this invention comprises, in a scanning electron microscope, a Braun tube to reproduce an image of a specimen, a horizontal scanning system including a horizontal sawtooth wave generator for supplying horizontal scanning sawtooth waves to a horizontal scanning deflection member in said Braun tube and a horizontal scanning deflection member in said microscope, a vertical scanning system including a vertical sawtooth wave generator for supplying vertical scanning sawtooth waves to a vertical scanning deflection member in said Braun tube and a vertical scanning deflection member in the microscope, an X direction astigmatism correcting system including an X direction astigmatism correcting current source for supplying an X direction astigmatism correcting current to an X direction astigmatism correcting member in said microscope, and a Y direction astigmatism correcting system including a Y direction astigmatism correcting current source for supplying a Y direction astigmatism correcting current to a Y direction astigmatism correcting member in said microscope, wherein said X direction astigmatism correcting system is connected through a first switch to one of said horizontal and vertical scanning system and said Y direction astigmatism correcting system through a second switch to the other of said scanning systems, and means for moving an astigmatism correcting image appearing on a part of a screen of said Braun tube until matching a predetermined point on said screen.

3. An apparatus for correcting astigmatism in scanning electron microscopes and similar equipment according to claim 2, in which the first and second switches are interlocked with each other.

4. An apparatus for correcting astigmatism in scanning electron microscopes and similar equipment according to claim 2, in which a reference mark for the correction of astigmatism is provided on the screen of the Braun tube.

5. An apparatus for correcting astigmatism in scanning electron microscopes and similar equipment according to claim 4, in which the reference mark is provided substantially at the center of the screen.

6. An apparatus for correcting astigmatism in scanning electron microscopes and similar equipment according to claim 4, in which the reference mark is provided on the screen by means of intensity modulation.

7. A method of correcting astigmatism in a scanning charged particle beam device having a display for visually displaying beam position in an X-Y coordinator system, comprising the steps of:
- generating a periodic X-direction scanning signal and a periodic Y-direction scanning signal;
- controlling scanning of the charged particle beam by the X-direction and the Y-direction scanning signals for scanning the charged particle beam in a scan field;
- generating a periodic X-direction astigmatism correcting signal and a periodic Y-direction astigmatism correcting signal;
- controlling astigmatism correction by the X-direction and Y-direction astigmatism correcting signals;
- visually displaying a predetermined mark positioned to represent the center of the charged particle beam scan field;
- visually displaying an image corrected for astigmatism by the periodic X-direction astigmatism correcting signal and the Y-direction astigmatism correcting signal; and
- adjusting the periodic X-direction and Y-direction astigmatism correcting signals to position the image corrected for astigmatism to coincide with the predetermined mark representative of the center of the charged particle beam scan field.

8. A method of correcting astigmatism according to claim 7, wherein the step of visually displaying a predetermined mark positioned to represent the center of the charged particle beam scan field is comprised of: generating periodic mark display signals in synchronism with the periodic X-direction and the Y-direction scan signals and timed relative to the periodic X-direction and Y-direction scan display signals for effectuating display of a mark positioned to represent the center of the charged particle beam scan field; and applying the mark display signals to display the predetermined mark.

9. A method of correcting astigmatism according to claim 7, wherein the step of visually displaying a predetermined mark positioned to represent the center of the charged particle beam scan field is comprised of: affixing a permanent mark on the display at a position corresponding to the center of the charged particle beam scan field.

* * * * *